United States Patent [19]
Hosogi

[11] Patent Number: 5,886,373
[45] Date of Patent: Mar. 23, 1999

[54] FIELD EFFECT TRANSISTOR

[75] Inventor: Kenji Hosogi, Tokyo, Japan

[73] Assignee: Mitsubishi Denki Kabushiki Kaisha, Tokyo, Japan

[21] Appl. No.: 890,517

[22] Filed: Jul. 9, 1997

[30] Foreign Application Priority Data

Jan. 27, 1997 [JP] Japan .................................. 9-012346

[51] Int. Cl.⁶ .................................................. H01L 29/80
[52] U.S. Cl. .......................................... 257/284; 257/283
[58] Field of Search ..................................... 257/283, 284

[56] References Cited

FOREIGN PATENT DOCUMENTS

| | | |
|---|---|---|
| 63-120470 | 5/1988 | Japan . |
| 64-7664 | 1/1989 | Japan . |
| 2262342 | 10/1990 | Japan . |
| 4336432 | 11/1992 | Japan . |
| 6045363 | 2/1994 | Japan ..................................... 257/284 |
| 897232 | 4/1996 | Japan . |

OTHER PUBLICATIONS

Kohno et al., "Modeling And Suppression Of The Surface Trap Effect On Drain Current Frequency Dispersions In GaAs MESFETs", 1994 IEEE GaAs IC Symposium, pp. 263–266, Dec. 1994.

Tanaka et al., "1.5 V–Operation GaAs Spike–gate Power FET With 65% Power–added Efficiency", 1995 IEEE IEDM 95, pp. 181–184, Dec. 1995.

IEEE Transactions on Electron Devices, vol. 42, No. 2, pp. 209–214 by Gaquiere et al. Feb. 1995.

*Primary Examiner*—Mark V. Prenty
*Attorney, Agent, or Firm*—Leydig, Voit & Mayer

[57] ABSTRACT

A method of fabricating a field effect transistor with a spike-gate structure including forming a semiconductor layer on a semi-insulating substrate, and forming a recess having a spike shape in which a portion of a gate electrode projects into the semiconductor layer, in the semiconductor layer. The formation of the recess includes forming a narrow damaged layer in the semiconductor layer by one of focused ion beamion implantation and ion implantation; and wet-etching the semiconductor layer utilizing accelerated etching of the damaged layer, thereby forming a recess having a spike groove. As described above, without performing the complicated processes as in the prior art fabricating method shown in FIGS. 12(a)–12(i), by performing one FIB implantation process, an FET with a spike-gate structure can be fabricated by using simpler and fewer processes.

1 Claim, 10 Drawing Sheets

Prior Art

Prior Art

Prior Art

FIELD EFFECT TRANSISTOR

FIELD OF THE INVENTION

The present invention relates to a field effect transistor having a Schottky contact structure and a fabricating method thereof and, more particularly, to a field effect transistor (hereinafter referred to as FET) for high power out put and a fabricating method thereof.

BACKGROUND OF THE INVENTION

Schottky contact type field effect transistors (MESFETs) comprising a compound semiconductor, basically GaAs, have been widely utilized in various high frequency communication systems or the like because the MESFETs exhibit good characteristics in a microwave band or in a millimeter wave band. Especially, high power transistors employed in these systems require high performance. While output power, amplification factor, power efficiency and the like are generally raised as the characteristics required for high power transistors, it is required to pay attention even to the response characteristic for very short times, i.e., nanosecond to millisecond, according to uses. Generally, a high power GaAs MESFET has a recessed gate structure in which a gate electrode is disposed in a groove, i.e., a recess of a semiconductor layer.

Figure 9:
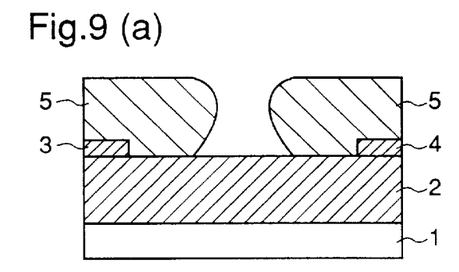
FIGS. 9(a)–9(f) are cross-sectional views illustrating process steps in a method of fabricating a prior art double recessed gate FET.

FIG. 9(f) shows a schematic cross-section of a prior art FET with a double recessed structure, disclosed in the GaAs IC Symposium Technical Digest, pp.263–266, 1994 (hereinafter referred to as literature (1)). In the figure, reference numeral 1 designates a semi-insulating GaAs substrate. A channel layer 2 is disposed on the substrate 1, and a source electrode 3, a drain electrode 4 and a gate electrode 7 are respectively disposed on the channel layer 2. This FET is obtained by etching a portion of the channel layer 2 comprising GaAs with conventional chemical etching to form a groove, i.e., a recess 6, and forming the gate electrode 7 in the recess 6.

As one of transistor characteristics for limiting output power that is important for a high power transistor, the breakdown voltage between the gate electrode and the drain electrode (hereinafter referred to as gate breakdown voltage) is raised. The gate breakdown voltage largely depends on the distance between the gate electrode and the drain electrode. Generally, the longer this distance is, the more the gate breakdown voltage is improved.

In the FET having the recess structure shown in FIG. 9(f), since the resistance of the channel layer portion thinned by the depth of the recess 6 increases, the gate breakdown voltage depends on the channel layer portion. That is, the gate breakdown voltage is improved as the distance between the gate electrode 7 and the edge of the recess 6 becomes larger. If this distance is large, however, the distance between the gate electrode 7 and the source electrode 3 is lengthened, which causes an increase in source parasitic resistance. Therefore, the distance between the gate electrode 7 and the edge of the recess 6 should be set to the most suitable value, considering the gate breakdown voltage and the source parasitic resistance.

In addition, in the FET with the recess structure described above, when a bias voltage is applied to an input electrode, the current is delayed, i.e., output current lag occurs. Especially, it is called gate-lag when the input electrode is a gate electrode. As described in the literature (1), a double recessed structure is suitable for exceedingly improving the gate-lag with a reduction in gate breakdown voltage held to a minimum, and the double recessed gate FET is especially available.

A description is given of a method of fabricating the double recessed gate FET described in the literature (1).

FIGS. 9(a)–9(f) are cross-sectional views illustrating process steps in the fabricating method.

Initially, the conductive GaAs channel layer 2 is formed on the semi-insulating GaAs substrate 1, and the source electrode 3 and the drain electrode 4 are formed on portions of the channel layer 2 by photolithography. Then, a resist pattern 5 for forming the gate electrode 7 is formed over the portions of the channel layer 2 where the source and drain electrodes 3 and 4 are formed (FIG. 9(a)). It is required that the resist pattern 5 forms an overhanging shape as shown in FIG. 9(a), from restrictions in the following processes and, for example, an image reversal resist is used as the resist. In a high power FET, although a channel layer is often epitaxially grown by molecular beam epitaxy (MBE) or the like, it may be formed by ion implantation. In this case, the channel layer 2 is epitaxially grown and has a thickness of about 0.4 $\mu$m.

Thereafter, as shown in FIG. 9(b), using the resist pattern 5 as a mask, a portion of the GaAs channel layer 2 is wet-etched with an etchant comprising, for example, a mixture of ammonia and hydrogen peroxide, to form an upper recess 6b. The depth of the recess 6b is about 0.1 $\mu$m.

In the step of FIG. 9(c), a groove opposite to the resist opening and having almost the same width as the resist opening width is formed by dry etching which has a strong anisotropy, for example, reactive ion etching (RIE) using $Cl_2$ gas or the like, thereby forming the recess 6 comprising the groove and the upper recess 6b. The depth of the groove is about 0.1 $\mu$m.

Further, wet etching is performed with the same etchant as the first etchant comprising, for example, a mixture of ammonia and hydrogen peroxide, whereby the recess 6 extends in a width direction and in a depth direction as shown in FIG. 9(d). When this etching depth is about 0.1 $\mu$m, the thickness of the GaAs channel layer 2 just beneath the gate electrode 7 to be formed in the following process becomes 0.1 $\mu$m.

Subsequently, as shown in FIG. 9(e), a metal film, for example, a film comprising Ti and Au that are laminated, is deposited on the entire surface by an anisotropic technique, such as vacuum evaporation. At this time, the metal film 8 is formed on the resist pattern 5 as well. This metal film 8 is removed when the resist pattern 5 is removed with a solvent which can dissolve the resist pattern 5, such as an organic solvent. This is generally called lift-off. Especially, it is often employed for GaAs devices. Thereby, the gate electrode 7 is formed in the recess 6, completing the FET shown in FIG. 9(f).

In the FET with the double recessed structure that is formed as described above, the thickness of the channel layer 2 just beneath the lower recess close to the gate electrode 7 is about 0.1 $\mu$m, i.e., smaller than the case of a single recessed structure. Therefore, it is hard for gate-lag to occur and the parasitic resistance becomes small. Further, since the upper recess 6b is spaced apart from the gate electrode 7, a high gate breakdown voltage is produced, like the single recessed structure, resulting in an FET having good characteristics for high power.

In the fabricating method described in the literature (1), however, since it is required to perform three etching processes (shown in FIGS. 9(b)–9(d)), so the fabrication process becomes a longer one. In addition, since the dry etching process (shown in FIG. 9(c)) generally requires high skill, reproducibility and controllability of the recess shape and the like are likely to be deteriorated.

As an FET fabricating method which can solve such problems, Japanese Published Patent Application No. Sho. 64-7664 discloses a method of fabricating an FET with a double recessed gate structure utilizing a phenomenon that etching of a layer damaged by ion implantation should be accelerated.

FIGS. 10(a)–10(d) are cross-sectional views illustrating process steps in a method of fabricating an FET with a double recessed gate structure utilizing an accelerated etching phenomenon. In these figures, the same reference numerals as those shown in FIGS. 9(a)–9(f) designate the same or corresponding parts.

Figure 10:
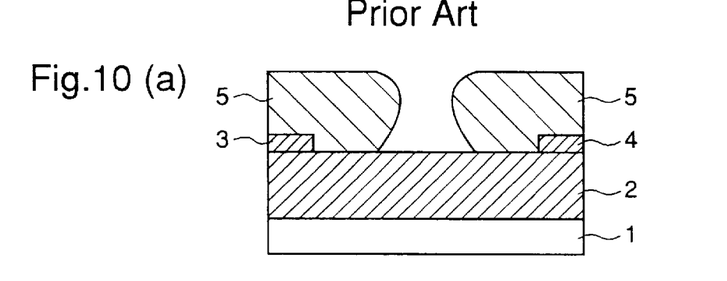
FIGS. 10(a)–10(d) are cross-sectional views illustrating process steps in another method of fabricating a prior art double recessed gate FET.

Initially, as shown in FIG. 10(a), the conductive GaAs channel layer 2 serving as a channel region is epitaxially grown on the semi-insulating GaAs substrate 1, and the source electrode 3 and the drain electrode 4 are formed on portions of the channel layer 2 by photolithography or the like. Then, the resist pattern 5 having an opening at a portion where the gate electrode 7 is to be formed is formed. The cross-section of the resist pattern 5 forms an overhanging shape shown in FIG. 10(a), because the overhanging shape is convenient for the following processes. Generally, an n type GaAs layer is used as the channel layer 2, and Si is usually introduced as the dopant impurity. The dopant concentration of the channel layer 2 is generally about $10^{17}$ $cm^{-3}$. In this case, the thickness of the channel layer 2 is about 0.4 $\mu$m.

Thereafter, as shown in FIG. 10(b), using the resist pattern 5 as a mask, ions 9 are implanted into a portion of the GaAs channel layer 2 to form a damaged layer 10 in the vicinity of the surface of the channel layer portion. Since the ions are stopped in the resist pattern 5, no ion implantation is performed to portions of the channel layer 2, except for the portion just beneath the opening of the resist pattern 5.

Subsequently, a portion of the GaAs channel layer 2 including the damaged layer 10 is etched with an etchant comprising, for example, a mixture of ammonia and hydrogen peroxide, to form the recess 6 with a double recessed structure shown in FIG. 10(c), because the damaged layer 10 damaged by the ion implantation has a higher etching rate than that of the other portion of the channel layer 2.

Then, by vacuum evaporation and lift-off comprising depositing a gate metal on the entire surface by conventional vacuum evaporation and lifting-off the gate metal, the gate electrode 7 is formed in the recess 6, completing an FET shown in FIG. 10(d).

In the fabricating method described above, the double recessed structure is formed with one wet etching process. Therefore, the fabrication processes is simpler than the processes shown in FIGS. 9(a)–9(f). In addition, the prior art method of fabricating a double recessed structure includes a plurality of resist formation processes and the like and is considerably difficult, as compared with a method of fabricating a single recessed structure, whereas the fabricating method shown in FIGS. 10(a)–10(d) comprises a method of fabricating a single recessed structure to which only the process for implanting the ions (shown in FIG. 10(b)) is added, and, further, controllability of the recess shape and the like in this method is improved.

In the fabricating method shown in FIGS. 10(a)–10(d), however, the wet etching is performed to the damaged layer 10 having a higher etching rate simultaneously when the channel layer 2 is wet-etched, so that the controllability of the recess shape is deteriorated and the lower recess shape becomes gentle. As a result, it is difficult to further improve the gate breakdown voltage.

IEDM Technical Digest, pp.181–184, 1995 (hereinafter referred to as literature (2)) discloses a high power GaAs MESFET with a spike-gate, that is, a spike-shaped structure in which a portion of a gate electrode projects into a semiconductor layer beneath the gate electrode.

Figure 11:
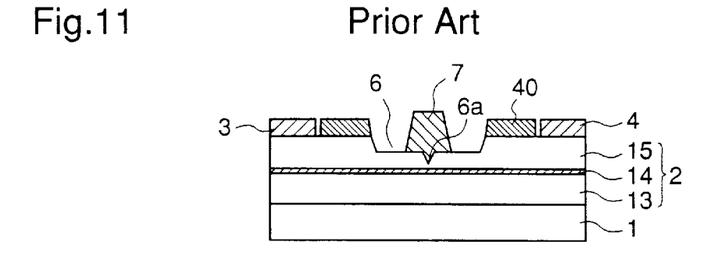
FIG. 11 is a cross-sectional view illustrating a prior art spike-gate FET.

FIG. 11 is a cross-sectional view illustrating this spike-gate FET. In the FIG., reference numeral 1 designates a semi-insulating GaAs substrate. An insulating semiconductor layer 13, a delta-doped layer 14 and an insulating semiconductor layer 15 serving as a channel layer 2 are successively disposed on the substrate 1. A source electrode 3, a drain electrode 4 and $SiO_2$ films 40 are respectively disposed on the insulating semiconductor layer 15. A gate electrode 7 is disposed in a recess 6 having a spike groove 6a.

In this FET, the gate electrode 7 makes contact with the insulating semiconductor layer 15 undoped with a dopant impurity. The channel comprises the delta-doped layer 14 having a high dopant concentration and an extremely small thickness and is separated from the gate electrode 7 by the insulating semiconductor layer 15. By using such a structure, the current control operation of the transistor is performed at a portion at which the distance between the gate electrode 7 and the channel (delta-doped layer 14), i.e., the gate length, is the shortest, that is, at the spike-shaped portion of the gate electrode 7 projecting into the semiconductor layer 15. Accordingly, this spike-gate FET realizes an extremely short gate length. Generally, the gate resistance increases with the shortened gate length, thereby degrading high frequency characteristics of an FET. In the spike-gate FET, however, since the sectional area of the gate electrode 7 itself is the same as in the prior art structure, the increase in gate resistance which degrades high frequency characteristics does not occur.

A description is given of a method of fabricating the spike-gate FET described in the literature (2).

FIGS. 12(a)–12(i) are cross-sectional views illustrating process steps in the fabricating method. In these figures, in order to simplify the figures, a detailed layer structure of the channel layer 2 is not shown.

Figure 12:
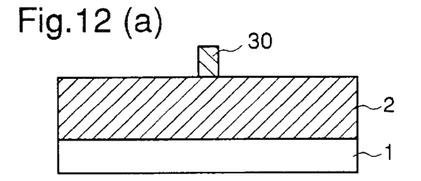
FIGS. 12(a)–12(i) are cross-sectional views illustrating process steps in a method of fabricating the prior art spike-gate FET.

Initially, as shown in FIG. 12(a), the channel layer 2 is epitaxially grown on the semi-insulating GaAs substrate 1, and a narrow resist pattern 30 is formed on the channel layer 2. The width of the resist pattern 30 is about 0.15 $\mu$m.

Next, as shown in FIG. 12(b), the $SiO_2$ film 40 is deposited on the entire surface by vacuum evaporation.

As shown in FIG. 12(c), lift-off of the $SiO_2$ film 40 is performed to form a narrow opening 30a.

As shown in FIG. 12(d), by conventional photolithography and etching of the $SiO_2$ film 40, openings for forming the source electrode 3 and the drain electrode 4 are formed in the $SiO_2$ film 40.

Subsequently, as shown in FIG. 12(e), the source electrode 3 and the drain electrode 4 are formed in the openings of the $SiO_2$ film 40 by vacuum evaporation and lift-off. Then, after forming a resist pattern 70 having an opening at a portion where the gate electrode 7 is to be formed, a shallow groove 2a is formed in the channel layer 2 with a mixture of tartaric acid and hydrogen peroxide. In this case, the opening width of the resist pattern 70 determines the maximum width of the gate electrode 7.

Thereafter, as shown in FIG. 12(f), the $SiO_2$ film 40 is selectively etched in a transverse direction with, for example, a solution of hydrofluoric acid.

Then, as shown in FIG. 12(g), the channel layer 2 is selectively etched with, for example, a mixture of tartaric acid and hydrogen peroxide, to form the recess 6 having the spike groove 6a.

In the step of FIG. 12(h), a gate metal is deposited on the entire surface by vacuum evaporation and the resist pattern 70 is removed by lift-off, thereby forming the gate electrode 7 in the recess 6, completing the spike-gate FET shown in FIG. 12(i).

In the method of fabricating the spike-gate FET described above, since it is required to perform two photolithographic processes for forming the resist patterns 30 and 70, two processes for etching the GaAs channel layer 2, a few processes for forming and etching the SiO$_2$ film 40 and the like, the fabrication process is relatively complicated.

In addition, since it is not easy to improve controllability of the etching size in a transverse direction, i.e., side etching size, of the SiO$_2$ film 40 (shown in FIG. 12(f)), controllability of the recess shape and the like is deteriorated.

Further, in this method, because the spike groove 6a is formed automatically in the middle of the gate electrode 7, this groove cannot be offset to the source electrode side or the drain electrode side in order to improve characteristics, so that it is difficult to realize a degree of freedom in the design of the source parasitic resistance, the gate capacitance and the like.

SUMMARY OF THE INVENTION

It is an object of the present invention to provide an FET that can realize a degree of freedom in the design of the source parasitic resistance and the gate capacitance, and a method of fabricating a recessed gate FET having good precision in size using a simpler and shorter process than in the prior art methods.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a field effect transistor comprises a semi-insulating substrate; a conductive semiconductor layer disposed on the semi-insulating substrate; a source electrode and a drain electrode disposed on the semiconductor layer; a recess having a spike groove in the semiconductor layer between the source and drain electrodes, the spike groove being offset to one of the source electrode side and the drain electrode side; and a gate electrode disposed in the recess. As described above, by making the spike groove offset to the source electrode side or the drain electrode side, degree of freedom in design of the source parasitic resistance, the gate capacitance and the like is increased, resulting in a higher performance FET. More specifically, when the spike groove is offset to the source electrode side, the reduction in source resistance limiting the mutual conductance of the FET and the reduction in parasitic capacitance between the source electrode and the gate electrode can be realized. When the spike groove is offset to the drain electrode side, the capacitance between the drain electrode and the gate electrode can be reduced, thereby obtaining improved gain. In addition, in this FET, because the surface of the channel layer in the vicinity of the gate electrode causing a gate-lag phenomenon is covered with the gate electrode, it is hard for the gate-lag to occur.

According to a second aspect of the present invention, in a method of fabricating a field effect transistor with a spike-gate structure including forming a semiconductor layer on a semi-insulating substrate, and forming a recess having a spike groove of a spike shape in which a portion of a gate electrode projects into the semiconductor layer, in the semiconductor layer, the formation of the recess comprises forming a narrow damaged layer in the semiconductor layer by one of focused ion beam implantation and ion implantation; and wet-etching the semiconductor layer utilizing accelerated etching of the damaged layer, thereby forming a recess having a spike groove. As described above, without performing the complicated processes as in the prior art fabricating method shown in FIGS. 12(a)–12(i), by performing one FIB implantation process, an FET with a spike-gate structure can be fabricated by using simpler and shorter processes.

According to a third aspect of the present invention, in a method of fabricating a field effect transistor with a recessed gate structure including forming a semiconductor layer on a semi-insulating substrate, forming a recess in the semiconductor layer, and forming a gate electrode in the recess, the formation of the recess comprises forming a damaged layer in the semiconductor layer by one of focused ion beam implantation and ion implantation; selectively etching only the damaged layer to form an etching groove; and wet-etching the semiconductor layer, thereby forming a multi-stage recess. Thereby, the shape of the lower recess can be made sharp. As a result, an FET having a sharp recess which generally has the advantage of improving the gate breakdown voltage can be fabricated by using simpler and shorter processes.

According to a fourth aspect of the present invention, in the fabricating method of the third aspect of the invention including, before forming the recess, forming a resist pattern having a cross-section of an overhanging shape and having an opening, on the semiconductor layer on which a source electrode and a drain electrode are previously formed, the formation of the damaged layer comprises forming a wide damaged layer in the semiconductor layer by oblique ion implantation; and the formation of the etching groove and the formation of the multi-stage recess comprise wet-etching the semiconductor layer utilizing accelerated etching of the damaged layer, thereby forming a multi-stage recess having a lower recess wider than the opening of the resist pattern. As described above, the double recess having the wide lower recess can be formed. As a result, an FET having the increased gate breakdown voltage can be fabricated by using simpler and shorter processes.

According to a fifth aspect of the present invention, in the fabricating method of the third aspect of the invention including, before forming the recess, forming a resist pattern for the gate electrode on the semiconductor layer on which a source electrode and a drain electrode are previously formed, and wet-etching the semiconductor layer, the formation of the damaged layer comprises, after stopping the wet etching when a shallow recess is formed, forming a damaged layer in the shallow recess by one of focused ion beam implantation and ion implantation; and the formation of the etching groove and the formation of the multi-stage recess comprise wet-etching the semiconductor layer again, thereby forming a multi-stage recess. Therefore, the size of the damaged layer extending by the etching is reduced, and the distance between the gate electrode and the edge of the lower recess is narrowed. As a result, an FET having the reduced source resistance and the suppressed the gate-lag phenomenon can be fabricated by using simpler and shorter processes.

According to a sixth aspect of the present invention, the fabricating method of any of second to fifth aspects includes, before forming the resist pattern determining the width of the gate electrode on the semiconductor layer, forming a damaged layer for an upper recess in the semiconductor layer by ion implantation. Thereby, the recess having the wide upper recess is formed. As a result, an FET having the increased gate breakdown voltage and the reduced gate floating capacitance can be fabricated by using simpler and shorter processes.

According to a seventh aspect of the present invention, in the fabricating method of any of second to fifth aspects, the formation of the damaged layer includes making the damaged layer offset to one of the source and drain electrodes. As described above, by making the spike groove offset to the source electrode side or the drain electrode side, degree of freedom in design of the source parasitic resistance, the gate capacitance and the like is increased, whereby a higher performance FET can be fabricated by using simpler and shorter processes.

DETAILED DESCRIPTION OF THE PREFERRED EMBODIMENTS

[Embodiment 1.]

A first embodiment according to the present invention relates to a method of fabricating a field effect transistor (hereinafter referred to as an FET) having a spike-gate structure.

A description is given of the FET fabricating method according to the first embodiment of the invention.

FIGS. 1(a)–1(d) are cross-sectional views illustrating process steps in the fabricating method.

Figure 1:
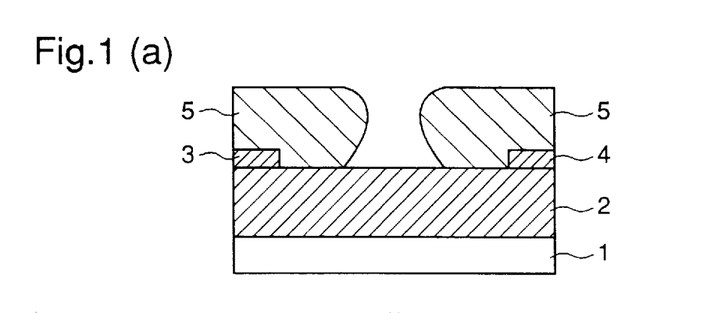
FIGS. 1(a)–1(d) are cross-sectional views illustrating process steps in a method of fabricating a spike-gate FET in accordance with a first embodiment of the present invention.

Initially, as shown in FIG. 1(a), a conductive GaAs channel layer 2 is formed on a semi-insulating GaAs substrate 1 by epitaxial growth or by ion implantation. The channel layer 2 has a thickness of about 0.4 $\mu$m and a dopant concentration of about $10^{17}$ cm$^{-3}$. Generally, an n type GaAs layer is used as the channel layer 2, and Si is usually introduced as the dopant impurity. Then, a source electrode 3 and a drain electrode 4 are formed on prescribed portions of the channel layer 2 by photolithography. Thereafter, a resist pattern 5 having openings where a gate electrode 7 is to be formed and where the source and drain electrodes 3 and 4 are formed. The cross-section of the resist pattern 5 forms an overhanging shape as shown in FIG. 1(a) and, for example, an image reversal resist is used as the resist.

Subsequently, as shown in FIG. 1(b), utilizing direct drawing technique with a focused ion beam (FIB) 9, the ion beam 9 implantsions into a portion of the channel layer 2 through the opening of the resist pattern 5 to form a narrow damaged layer 12 having a width of about 0.1 $\mu$m. The FIB technique is a method for implanting ions, using a focused ion beam, into a desired region. In this technique, the ion implantation region can be formed without using a resist pattern. In this point, the FIB technique is different from a conventional ion implantation. As is known from this, the damaged layer 12 may be formed before forming the resist pattern 5.

Then, as shown in FIG. 1(c), using the resist pattern 5 as a mask, a portion of the channel layer 2 including the damaged layer 12 is wet-etched with an etchant comprising a mixture of ammonia and hydrogen peroxide. Because the damaged layer 12 damaged by the FIB implantation has a higher etching rate than that of the other portion of the channel layer 2, a recess 6 with a narrow spike groove 6a having a width corresponding to the width of the damaged layer 12 is formed in the channel layer 2.

In the step of FIG. 1(d), by vacuum evaporation and lift-off, that is, by depositing a gate metal on the entire surface by conventional vacuum evaporation or the like and removing the resist pattern 5, a gate electrode 7 is formed in the recess 6, completing an FET with a structure in which a portion of the gate electrode 7 is buried in the spike groove 6a. Although subsequent to the above-described processes, a few processes, such as a process for depositing an insulating film on the entire surface to protect the FET, are usually performed, these processes are unrelated to the characterization of the present invention. Accordingly, a detailed description is not shown.

Generally, characteristics of a crystal material vary by damaging the crystal material, and there is a case where an etching rate with an etchant for wet etching increases. In the first embodiment of the invention, by utilizing this characteristic, the spike-gate structure is realized. The FIB is used for forming the damaged layer 12, because the FIB technique has been widely made practicable as a technique for introducing a dopant impurity with high precision, and the depth of the damaged layer 12 is controlled with good precision. In the FIB technique, the depth of the damaged layer 12 can be adjusted depending on an energy applied to the FIB, i.e., an acceleration voltage, the number of implanted ions, i.e., a dose quantity, and the kind of implanted ions.

However, in order to restore the crystal structure of the damaged layer 12 damaged by the FIB, it is usually required to perform high temperature processing at about 800° C., while as is known from the process flow in the first embodiment of the invention, the high temperature processing cannot be performed to the FET which provides heat nonresistant materials, such as the resist pattern 5, the source electrode 3, the drain electrode 4 and the gate electrode 7.

Therefore, it is necessary that the depth of the damaged layer 12 be within a depth to which the channel layer 2 is removed by wet etching. There is a possibility of degrading the performance of the FET, if the damaged layer 12 and the dopant impurity by the FIB implantation remain in the channel layer 2 below the gate electrode 7.

For this reason, the conditions of the FIB implantation should be carefully determined. A description is given of the implantation conditions by using a model channel thickness for a high power FET as an example. When the thickness of the low-resistance GaAs channel layer 2 is 0.4 µm and the final thickness of the channel layer 2 remaining beneath the gate electrode 7 is 0.1 µm, the depths of the damaged region and the dopant impurity by the FIB implantation must not exceed 0.3 µm. Although the dopant concentration distribution and the distribution of the damaged layer 12 do not strictly agree with each other, these distributions are assumed to be identical in order to simplify the explanation. The distribution of the dopant concentration produced by the FIB in a depth direction approximates a standard Gaussian distribution. In this distribution, the concentration becomes maximum at a certain depth, and the concentration exponentially decreases as the depth is more distant from the certain depth. Concerning the dopant concentration, it is thought that a concentration not exceeding about $10^{15}$ cm$^{-3}$ does not greatly affect the performance of the device. Therefore, for example, if the damaged layer 12 is formed to a depth not exceeding 0.2 µm, considering its margin, reasonable conditions are an acceleration voltage of about 80 keV and a dose quantity of about $3 \times 10^{13}$ cm$^{-2}$ when Si is employed as the implanted ion, and an acceleration voltage of about 200 keV and a dose quantity of about $3 \times 10^{13}$ cm$^{-2}$ when As is employed as the implanted ion. In this case, Si and As are raised as the kinds of the implanted ions of the FIB. This is because Si is the element previously doped into the channel layer 2 and As is the component element of the n type GaAs layer and it is considered that these elements hardly affect the transistor performance even if a very small amount of them remains. In fact, however, this is insignificant for the reason concerning the dopant concentration described above, and the element kinds are not limited to Si and As. In addition, ions having larger atomic weights usually greatly damage crystals. Therefore, when a heavier element is employed in a permissible range of the accelerating ability of an FIB apparatus, the implantation quantity of the element is made less, so that the time required for implantation processing is shortened, resulting in still more improved productivity in FET fabrication.

While the above description is given of FIB implantation, it also applies to a conventional ion implantation.

As described above, in the FET fabricating method according to the first embodiment of the invention, without performing the complicated processes as in the prior art fabricating method, by performing one FIB implantation process (shown in FIG. 1(b)), an FET with a spike-gate structure can be fabricated using simpler and fewer steps.

In addition, in the FET fabricating method of the first embodiment, for convenience, it seems in FIGS. 1(a)–1(d) as if the channel layer 2 is uniformly doped. However, the channel layer 2 may be, for example, delta-doped with a dopant impurity as the channel layer shown in FIG. 11.

Further, whether the width of the spike groove 6a corresponding to the spike portion may be large, or the resist pattern 5 having a narrower opening is formed by electron beam direct drawing technique or the like, the same structure can be realized by ion implantation using resist processes instead of the FIB implantation.

[Embodiment 2]

A second embodiment of the present invention relates to an FET having a spike-gate structure.

Figure 2:
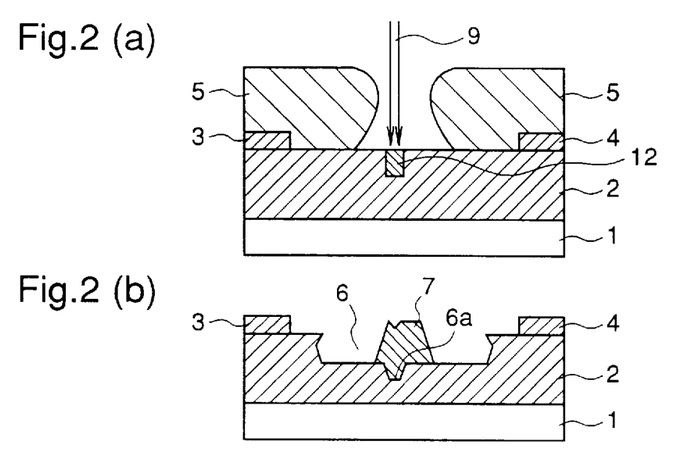
FIGS. 2(a) and 2(b) are cross-sectional views illustrating an offset spike-gate FET in accordance with a second embodiment of the present invention, and process steps in a method of fabricating an offset spike-gate FET in accordance with a third embodiment of the present invention.

FIG. 2(b) is a cross-sectional view illustrating an FET according to the second embodiment of the invention. In the figure, the same reference numerals as those shown in FIG. 1(d) designate the same or corresponding parts.

In the FET of the second embodiment, as shown in FIG. 2(b), the conductive channel layer 2 is disposed on the semi-insulating substrate 1, and the source electrode 3 and the drain electrode 4 are respectively disposed on prescribed portions of the channel layer 2. The gate electrode 7 is disposed in the recess 6 between the source electrode 3 and the drain electrode 4. The recess 6 has the spike groove 6a at the bottom surface, and a portion of the gate electrode 7 projects into the spike groove 6a. This spike groove 6a is different from those shown in FIGS. 1(d) and 11 and is offset. More specifically, the spike groove 6a is closer to the source electrode with respect to the center between the source and drain electrodes.

As described above, in the FET according to the second embodiment of the invention, since the spike groove 6a is offset to the source electrode side, the reduction in source resistance limiting the mutual conductance of the FET and the reduction in parasitic capacitance between the source electrode 3 and the gate electrode 7 can be realized. In addition, because the surface of the channel layer 2 in the vicinity of the gate electrode 7 causing a gate-lag phenomenon is covered with the gate electrode 7, it is hard for gate-lag to occur.

Although in the FET of the second embodiment, the spike groove 6a is offset to the source electrode side, this spike groove may be offset to the drain electrode side. By making the spike groove 6a offset to the drain electrode side, the capacitance between the drain electrode 4 and the gate electrode 7 is reduced, thereby obtaining an improved gain.

It is required to most suitably determine how much and to which of the source electrode and drain electrode sides the spike groove 6a is to be offset, depending on uses, operating frequencies, and sizes except the offset quantity and the like. However, by making the offset structure possible, the degree of freedom in design of the source parasitic resistance, the gate capacitance and the like is increased, resulting in a higher performance element.

[Embodiment 3]

A third embodiment according to the present invention relates to a method of fabricating the FET according to the second embodiment.

A description is given of the FET fabricating method according to the third embodiment of the invention.

FIGS. 2(a) and 2(b) are cross-sectional views illustrating process steps in the fabricating method. In these figures, the same reference numerals as those shown in FIGS. 1(a)–1(d) designate the same or corresponding parts.

Initially, as in the first embodiment of the invention, the channel layer 2 is formed on the semi-insulating substrate 1, the source electrode 3 and the drain electrode 4 are formed on prescribed portions of the channel layer 2, and the resist pattern 5 having an opening at a portion where the gate electrode 7 is to be formed is formed over the portions of the channel layer 2 (refer to FIG. 1(a)).

Subsequently, utilizing direct drawing with the focused ion beam (FIB) 9, the FIB 9 implants ions through the opening of the resist pattern 5 to form the narrow damaged layer 12 having a width of about 0.1 µm. At this time, as shown in FIG. 2(a), the FIB implantation is performed to a portion of the channel layer 2 closer to the source electrode 3, unlike the case of the first embodiment. Thereby, the narrow damaged layer 12 is offset to the source electrode side.

Thereafter, as in the first embodiment of the invention, using the resist pattern 5 as a mask, a portion of the channel layer 2 including the damaged layer 12 is wet-etched with an etchant comprising a mixture of ammonia and hydrogen peroxide to form the recess 6 with the spike groove 6a. Then, by vacuum evaporation and lift-off, the gate electrode 7 is formed in the recess 6, completing the spike-gate FET in which the spike groove 6a is offset to the source electrode side, as shown in FIG. 2(b).

As described above, in the FET fabricating method according to the third embodiment of the invention, by performing one FIB implantation process, the spike-gate FET in which the spike groove 6a is offset to the source electrode side can be fabricated by using simpler and fewer processes.

In addition, in the FET fabricating method of the third embodiment, as in the method of the first embodiment, the damaged layer 12 may be formed before forming the resist pattern 5. Further, the channel layer 2 may be delta-doped with a dopant impurity as the channel layer shown in FIG. 11. Furthermore, the spike groove 6a may be made closer to the drain electrode 4.

[Embodiment 4]

A fourth embodiment according to the present invention relates to a method of fabricating a double recessed gate FET having a spike-gate.

A description is given of the FET fabricating method according to the fourth embodiment of the invention.

Figure 3:
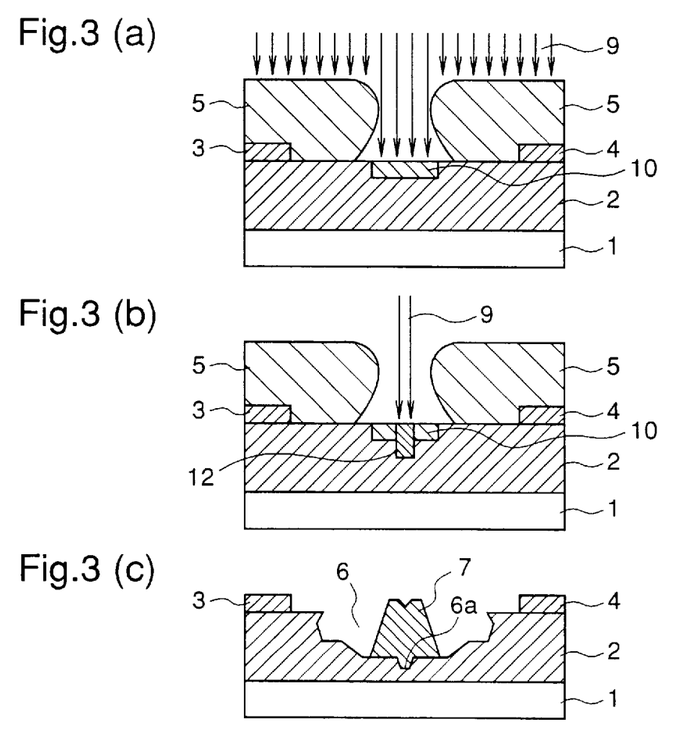
FIGS. 3(a)–3(c) are cross-sectional views illustrating process steps in a method of fabricating a double recessed spike-gate FET in accordance with a fourth embodiment of the present invention.

FIGS. 3(a)–3(c) are cross-sectional views illustrating process steps in the fabricating method. In these figures, the same reference numerals as those shown in FIGS. 1(a)–1(d) designate the same or corresponding parts. Reference numeral 10 designates a damaged layer.

Initially, as in the first embodiment of the invention, the channel layer 2 is formed on the semi-insulating substrate 1, the source electrode 3 and the drain electrode 4 are formed on prescribed portions of the channel layer 2, and the resist pattern 5 having an opening at a portion where the gate electrode 7 is to be formed is formed over the portions of the channel layer 2 (refer to FIG. 1(a)).

Subsequently, as shown in FIG. 3(a), ions 9 are implanted to the entire surface to form the damaged layer 10 having a width that is determined by the opening of the resist pattern 5.

Thereafter, as shown in FIG. 3(b), the FIB 9 implants ions through the opening of the resist pattern 5 to form the narrow damaged layer 12.

Then, as in the first embodiment of the invention, using the resist pattern 5 as a mask, a portion of the channel layer 2 including the damaged layers 10 and 12 is wet-etched with an etchant comprising a mixture of ammonia and hydrogen peroxide. Because the damaged layers 10 and 12 have a higher etching rate than the other portion of the channel layer 2, the double recess 6 comprising an upper recess and a lower recess corresponding to the damaged layer 10 and the spike groove 6a corresponding to the damaged layer 12 is formed in the channel layer 2. Then, by vacuum evaporation and lift-off of a gate metal, the gate electrode 7 is formed in the double recess 6, completing an FET with a spike-gate structure and a double recessed structure as shown in FIG. 3(c).

As described above, in the FET fabricating method according to the fourth embodiment of the invention, an FET with a spike-gate structure and a double recessed structure and achieving high performance can be fabricated by using simpler and fewer processes.

In addition, in the FET that is fabricated in the fourth embodiment, the offset structure described in the third embodiment can be easily combined. By combining the offset structure, a reduction in source parasitic resistance can be realized.

[Embodiment 5]

A fifth embodiment according to the present invention relates to a method of fabricating a double recessed gate FET having a wide upper recess.

A description is given of the FET fabricating method according to the fifth embodiment of the invention.

FIGS. 4(a)–4(e) are cross-sectional views illustrating process steps in the fabricating method. In these figures, the same reference numerals as those shown in FIGS. 3(a)–3(c) designate the same or corresponding parts. Reference numeral 11 designates a damaged layer.

Initially, as in the first embodiment of the invention, the conductive GaAs channel layer 2 is formed on the semi-insulating GaAs substrate 1 by epitaxial growth or by ion implantation. Then, the source electrode 3 and the drain electrode 4 are formed on prescribed portions of the channel layer 2 by photolithography. Before forming the resist pattern 5 having an opening determining the width of the gate electrode 7, the damaged layer 11 is formed by ion implantation in a wider region of the channel layer 2 than the opening of the resist pattern 5 for the gate. This ion implantation is performed using conventional photolithography, and FIG. 4(a) shows the state after removing a resist pattern used for the photolithography.

Figure 4:
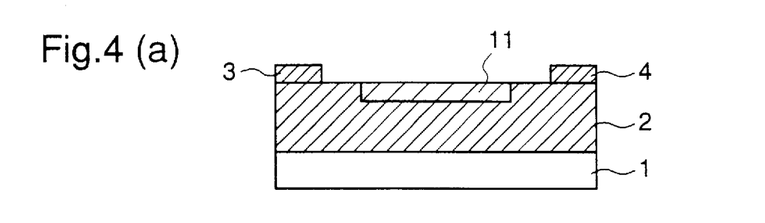
FIGS. 4(a)–4(e) are cross-sectional views illustrating process steps in a method of fabricating a double recessed gate FET in accordance with a fifth embodiment of the present invention.

Thereafter, as shown in FIG. 4(b), the resist pattern 5 having the opening is formed over the portions of the channel layer 2. The cross-section of the resist pattern 5 forms an overhanging shape.

Subsequently, as shown in FIG. 4(c), the ions 9 are implanted to the entire surface to form the damaged layer 10 in the middle of a recess formation region.

In the step of FIG. 4(d), using the resist pattern 5 as a mask, wet etching is performed with an etchant comprising a mixture of ammonia and hydrogen peroxide to form the double recess 6 having a wider upper recess than that in the prior art structure shown in FIG. 9(f).

Finally, by vacuum evaporation and lift-off of a gate metal, the gate electrode 7 is formed in the double recess 6, completing a double recessed gate FET as shown in FIG. 4(e).

As described above, in the FET fabricating method according to the fifth embodiment of the invention, before forming the resist pattern 5 for the gate electrode 7, the damaged layer 10 is formed by ion implantation. Then, wet etching is performed to form the recess 6 having the wide upper recess. As a result, an FET having increased gate breakdown voltage and reduced gate floating capacitance can be fabricated by using simpler and fewer processes. In addition, the size and the shape of the double recess 6 can be easily controlled by the ion implantation conditions of the damaged layers 10 and 11.

[Embodiment 6]

A sixth embodiment according to the present invention relates to a method of fabricating an FET for realizing an offset structure of the FET fabricated in the fifth embodiment.

A description is given of the FET fabricating method according to the sixth embodiment of the invention.

FIGS. 5(a)–5(e) are cross-sectional views illustrating process steps in the fabricating method. In these figures, the same reference numerals as those shown in FIGS. 4(a)–4(e) designate the same or corresponding parts.

Initially, as in the first embodiment of the invention, the conductive GaAs channel layer 2 is formed on the semi-insulating GaAs substrate 1 by epitaxial growth or by ion implantation. Then, the source electrode 3 and the drain electrode 4 are formed on prescribed portions of the channel layer 2 by photolithography. Before forming the resist pattern 5 having an opening determining the width of the gate electrode 7, the damaged layer 11 is formed by ion implantation in a wider region of the channel layer 2 than the opening of the resist pattern 5 for the gate. This ion implantation is performed using conventional photolithography, and FIG. 5(a) shows the state after removing a resist pattern used for the photolithography.

Figure 5:
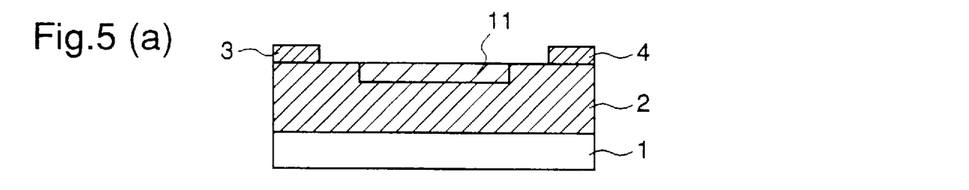
FIGS. 5(a)–5(e) are cross-sectional views illustrating process steps in a method of fabricating an offset double recessed gate FET in accordance with a sixth embodiment of the present invention.

Thereafter, as shown in FIG. 5(b), the resist pattern 5 having the opening is formed over the portions of the channel layer 2. The cross-section of the resist pattern 5 forms an overhanging shape. Unlike the resist pattern described in the fifth embodiment, this resist pattern 5 is offset to the source electrode side.

Subsequently, as shown in FIG. 5(c), the ions 9 are implanted to the entire surface to form the damaged layer 10 having a width that is determined by the opening of the resist pattern 5. At this time, the damaged layer 10 formed by the ion implantation becomes closer to the source electrode 3.

In the step of FIG. 5(d), using the resist pattern 5 as a mask, wet etching is performed with an etchant comprising a mixture of ammonia and hydrogen peroxide to form the double recess 6. Because the etching rate of the damaged layers 10 and 11 is higher, the lower recess becomes closer to the source in the recess.

Finally, by vacuum evaporation and lift-off of a gate metal, the gate electrode 7 is formed in the double recess 6, completing a double recessed gate FET in which the gate electrode 7 is offset to the source electrode side, as shown in FIG. 5(e).

As described above, in the FET fabricating method according to the sixth embodiment of the invention, by making the gate electrode 7 and the lower recess offset to the source electrode side in the recess 6, an FET, in which the source parasitic resistance greatly affecting FET performance is reduced and the gate breakdown voltage is improved because the distance between the gate electrode 7 and the recess edge at the side of the drain electrode 3 is longer, can be fabricated by using simpler and fewer processes.

[Embodiment 7]

A seventh embodiment according to the present invention relates to a method of fabricating a double recessed gate FET having a shorter distance between a gate electrode and a lower recess edge.

A description is given of the FET fabricating method according to the seventh embodiment of the invention.

Figure 6:
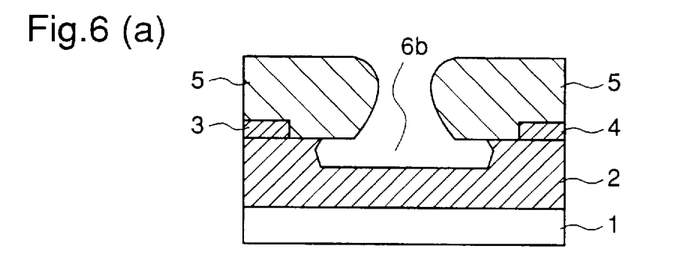
FIGS. 6(a)–6(c) are cross-sectional views illustrating process steps in a method of fabricating a double recessed gate FET in accordance with a seventh embodiment of the present invention.

FIGS. 6(a)–6(c) are cross-sectional views illustrating process steps in the fabricating method. In these figures, the same reference numerals as those shown in FIGS. 4(a)–4(e) designate the same or corresponding parts. Reference numeral 6b designates an upper recess.

Initially, as in the first embodiment of the invention, the conductive GaAs channel layer 2 is formed on the semi-insulating GaAs substrate 1 by epitaxial growth or by ion implantation. Then, the source electrode 3 and the drain electrode 4 are formed on prescribed portions of the channel layer 2 by photolithography. Subsequently, the resist pattern 5 having an opening determining the width of the gate electrode 7 is formed over the portions of the channel layer 2.

Thereafter, using the resist pattern 5 as a mask, wet etching is performed with an etchant comprising a mixture of ammonia and hydrogen peroxide. As shown in FIG. 6(a), this etching is stopped halfway, thereby forming the shallow upper recess 6b.

In the step of FIG. 6(b), the ions 9 are implanted to the entire surface to form the damaged layer 10 having a width that is determined by the opening of the resist pattern 5.

Then, the recess etching is performed again. Because the etching rate of the damaged layer 10 is higher than that of the other portion of the channel layer 2, the double recess 6 having a lower recess corresponding to the damaged layer 10 is formed in the channel layer 2.

Finally, by vacuum evaporation and lift-off of a gate metal, the gate electrode 7 is formed in the double recess 6, completing a double recessed gate FET as shown in FIG. 5(c).

As described above, in the FET fabricating method according to the seventh embodiment of the invention, the process for forming the damaged layer 10 by ion implantation is performed not before the recess etching but in the middle of the recess etching, whereby the size of the damaged layer 10 extended by the etching, especially in a transverse direction, is reduced, and the distance between the gate electrode 7 and the edge of the lower recess is narrowed. As a result, an FET having the reduced source resistance and suppressed gate-lag phenomenon can be fabricated by using simpler and fewer processes.

In the seventh embodiment of the invention, the distance between the gate electrode 7 and the edge of the lower recess can be varied by adjusting the depth of the first recess etching. Here, it is required to pay attention so that the maximum depth of the damaged layer 10 is smaller than when the damaged layer 10 is formed before the recess etching.

In addition, the ion implantation in the middle of the recess etching is not limited to one process but may be performed with several processes.

[Embodiment 8]

An eighth embodiment according to the present invention relates to a method of fabricating a double recessed gate FET having a wide lower recess.

A description is given of the FET fabricating method according to the eighth embodiment of the invention.

Figure 7:
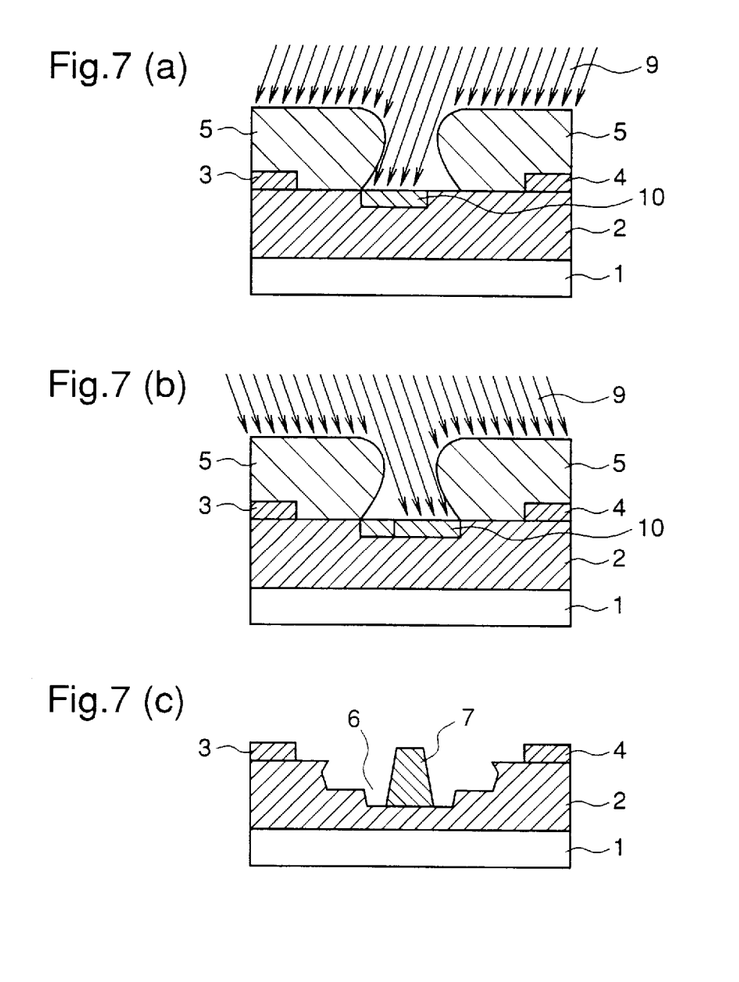
FIGS. 7(a)–7(c) are cross-sectional views illustrating process steps in a method of fabricating a double recessed gate FET in accordance with an eighth embodiment of the present invention.

FIGS. 7(a)–7(c) are cross-sectional views illustrating process steps in the fabricating method. In these figures, the same reference numerals as those shown in FIGS. 4(a)–4(e) designate the same or corresponding parts.

Initially, as in the first embodiment of the invention, the conductive GaAs channel layer 2 is formed on the semi-insulating GaAs substrate 1 by epitaxial growth or by ion implantation. Then, the source electrode 3 and the drain electrode 4 are formed on prescribed portions of the channel layer 2 by photolithography. Then, the resist pattern 5 having an opening determining the width of the gate electrode 7 is formed over the portions of the channel layer 2.

Thereafter, the damaged layer 10 having a width determined by the opening of the resist pattern 5 is formed by ion implantation. This ion implantation is characterized in that the ions 9 are implanted obliquely with respect to the substrate 1, as shown in FIG. 7(a). Subsequently, as shown in FIG. 7(b), for example, by rotating the substrate 1 by 180°, the ions are implanted obliquely from the opposite side. In this case, in order to make the recess 6 symmetrical, the ion implantation is performed twice by inclining the substrate 1 to right and left. However, even when the ion implantation is performed only from one side, an offset structure can be realized.

Then, using the resist pattern 5 as a mask, wet etching is performed with an etchant comprising a mixture of ammonia and hydrogen peroxide to form the double recess 6 having a wide lower recess.

Finally, by vacuum evaporation and lift-off of a gate metal, the gate electrode 7 is formed in the double recess 6, completing a double recessed gate FET as shown in FIG. 7(c).

As described above, in the FET fabricating method according to the eighth embodiment of the invention, after forming the resist pattern 5 having a cross-section of an overhanging shape, ion implantation is performed obliquely to form the wide damaged layer 10. Then, wet etching is performed to form the double recess having a wide lower recess. As a result, an FET having the increased gate breakdown voltage can be fabricated by using simpler and fewer processes.

[Embodiment 9]

A ninth embodiment according to the present invention relates to a method of fabricating a double recessed gate FET having a sharp lower recess.

A description is given of the FET fabricating method according to the ninth embodiment of the invention.

FIGS. 8(a)–8(e) are cross-sectional views illustrating process steps in the fabricating method. In these figures, the same reference numerals as those shown in FIGS. 4(a)–4(e) designate the same or corresponding parts.

Figure 8:
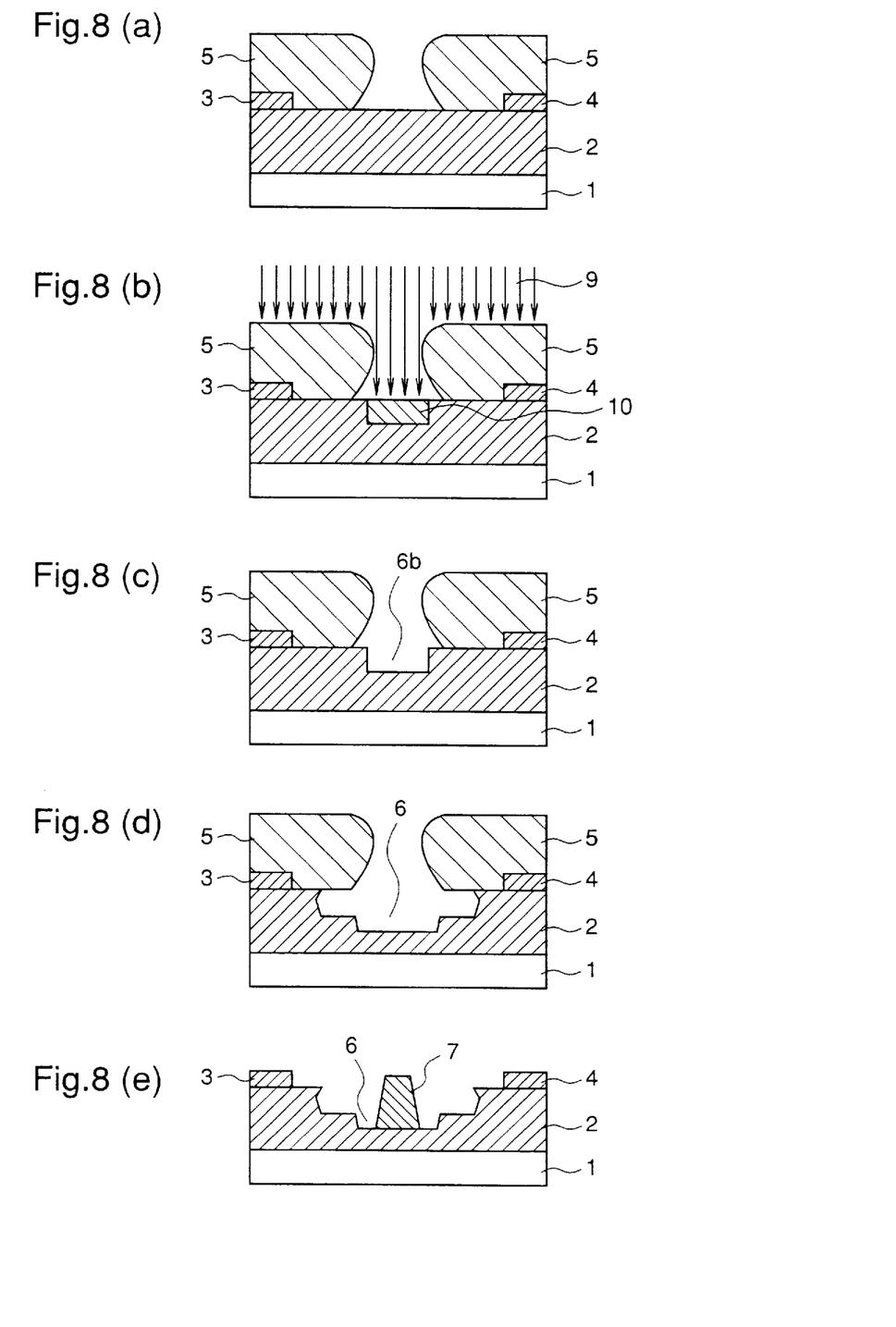
FIGS. 8(a)–8(e) are cross-sectional views illustrating process steps in a method of fabricating a double recessed gate FET in accordance with a ninth embodiment of the present invention.

Initially, as shown in FIG. 8(a), the conductive GaAs channel layer 2 is formed on the semi-insulating GaAs substrate 1 by epitaxial growth or by ion implantation. The channel layer 2 has a thickness of about 0.4 $\mu$m and a dopant concentration of about $10^{17}$ cm$^{-3}$. Generally, an n type GaAs layer is used as the channel layer 2, and Si is usually introduced as the dopant impurity. Then, the source electrode 3 and the drain electrode 4 are formed on prescribed portions of the channel layer 2 by photolithography. Thereafter, the resist pattern 5 having an opening at a portion where the gate electrode 7 is to be formed is formed over the portions of the channel layer 2. The cross-section of the resist pattern 5 forms an overhanging shape as shown in FIG. 8(a) and, for example, an image reversal resist is used as the resist.

Thereafter, as shown in FIG. 8(b), the ions 9 are implanted to the entire surface to form the damaged layer 10 having a width that is determined by the opening of the resist pattern 5.

In the step of FIG. 8(c), the wafer is immersed in a chemical which does not usually etch a GaAs crystal, such as a solution of hydrochloric acid or a solution of hydrofluoric acid, to substantially etch only the damaged layer 10, thereby forming a groove 6b. This groove 6b reflects the shape of the region damaged by the ion implantation, that is, the shape of the damaged layer 10, and the wall surface of the groove 6b become approximately perpendicular.

Subsequently, using the resist pattern 5 as a mask, wet etching is performed with an etchant comprising a mixture of ammonia and hydrogen peroxide to form the double recess 6 as shown in FIG. 8(d).

Then, a gate metal is deposited on the entire surface by conventional vacuum evaporation or the like and the resist pattern 5 is removed by lift-off, thereby forming the gate electrode 7 in the double recess 6, completing an FET with a structure in which the gate electrode 7 is formed on the lower recess of the double recess 6, as shown in FIG. 8(e).

As described above, in the FET fabricating method according to the ninth embodiment of the invention, after forming the damaged layer 10 having a width determined by the opening of the resist pattern 5, by ion implantation, only the damaged layer 10 is selectively etched and removed. Then, wet etching is performed to form the double recess having the sharp lower recess. As a result, an FET having a sharp recess which generally has the advantage of improving the gate breakdown voltage can be fabricated by using simpler and fewer processes.

In addition, the present invention is not limited to the FET fabricating methods of the first to ninth embodiments of the invention. For example, in the respective embodiments, the cross-section of the recess has a reverse mesa shape. However, by changing the direction in which the gate electrode is formed to a direction perpendicular to the substrate surface, the reverse mesa can be changed to a forward mesa shape. The present invention can be also applied to such a case.

In the respective embodiments of the invention, GaAs is used as the materials of the substrate 1 and the channel layer 2. However, other material which can exhibit an accelerated etching phenomenon of a layer damaged by ion implantation or FIB implantation, such as InP, may be employed.

What is claimed is:

1. A field effect transistor comprising:

a semi-insulating substrate;

a conductive semiconductor layer disposed on the semi-insulating substrate;

a source electrode and a drain electrode disposed on the semiconductor layer;

a recess symmetrically disposed in the semiconductor layer between the source and drain electrodes, the recess including a spike groove extending into the semiconductor layer within the recess, deeper than other parts of the recess, and asymmetrically disposed between the source electrode and the drain electrode; and a gate electrode symmetrically disposed in the recess between the source electrode and the drain electrode, on the semiconductor layer, and filling the spike groove, the gate electrode being wider than the spike groove.

* * * * *